(12) United States Patent
Shin et al.

(10) Patent No.: US 12,217,676 B2
(45) Date of Patent: Feb. 4, 2025

(54) DISPLAY DEVICE

(71) Applicant: Samsung Display Co., Ltd., Yongin-si (KR)

(72) Inventors: Kyoungju Shin, Hwaseong-si (KR); Yangsoo Kim, Cheonan-si (KR); Jungkook Park, Cheonan-si (KR); Jaeyoung Oh, Cheonan-si (KR); Woojin Lee, Asan-si (KR); Jaeho Jung, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 140 days.

(21) Appl. No.: 18/120,104

(22) Filed: Mar. 10, 2023

(65) Prior Publication Data
US 2023/0290307 A1 Sep. 14, 2023

(30) Foreign Application Priority Data
Mar. 11, 2022 (KR) .................. 10-2022-0030668

(51) Int. Cl.
*G09G 3/3233* (2016.01)
*H10K 59/131* (2023.01)
*H10K 59/35* (2023.01)

(52) U.S. Cl.
CPC ..... *G09G 3/3233* (2013.01); *G09G 2300/0426* (2013.01); *G09G 2300/0452* (2013.01); *G09G 2300/0819* (2013.01); *G09G 2300/0842* (2013.01); *G09G 2310/08* (2013.01); *H10K 59/131* (2023.02); *H10K 59/35* (2023.02)

(58) Field of Classification Search
CPC ......... G09G 3/3233; G09G 2300/0426; G09G 2300/0452; G09G 2300/0819; G09G 2300/0842; G09G 2310/08; G09G 2300/0861; G09G 2320/0238; G09G 2320/0242; G09G 3/32; G09G 3/2074; G09G 2330/021; H10K 59/131; H10K 59/35; H10K 50/805; H10K 59/1213; H10K 59/1216; H10K 59/124; H01L 29/7869

See application file for complete search history.

(56) References Cited

U.S. PATENT DOCUMENTS

| | | | |
|---|---|---|---|
| 11,211,011 B2 | 12/2021 | Kim et al. | |
| 11,257,437 B2 | 2/2022 | Kim et al. | |
| 2020/0365085 A1* | 11/2020 | Yang | G09G 3/3258 |
| 2021/0376041 A1 | 12/2021 | Lee et al. | |

FOREIGN PATENT DOCUMENTS

| | | |
|---|---|---|
| JP | 4942971 B2 | 5/2012 |
| KR | 1020210063653 A | 6/2021 |
| KR | 1020210124599 A | 10/2021 |
| KR | 1020210126177 A | 10/2021 |
| KR | 1020210149267 A | 12/2021 |

* cited by examiner

*Primary Examiner* — Matthew A Eason
*Assistant Examiner* — Chayce R Bibbee
(74) *Attorney, Agent, or Firm* — CANTOR COLBURN LLP

(57) ABSTRACT

A pixel circuit of a display device includes first to sixth thin-film transistors, and first and second capacitors. The first thin-film transistor generates a driving current, the sixth thin-film transistor is connected between a light-emitting element and the first thin-film transistor and controls a transfer of the driving current, and the second capacitor is connected between a gate electrode of the sixth thin-film transistor and the light-emitting element.

23 Claims, 10 Drawing Sheets

DISPLAY DEVICE

This application claims priority to Korean Patent Application No. 10-2022-0030668, filed on Mar. 11, 2022, and all the benefits accruing therefrom under 35 U.S.C. § 119, the content of which in its entirety is herein incorporated by reference.

BACKGROUND

1. Field

The disclosure herein relates to a display device in which low gray scale performance is enhanced.

2. Description of the Related Art

A display panel includes a plurality of pixels and driving circuits (e.g., a scan driving circuit, a data driving circuit, and a light-emitting driving circuit) for controlling the same. Each of the plurality of pixels includes a light-emitting element and a pixel circuit which controls the light-emitting element. The pixel circuit may include a plurality of thin-film transistors closely connected to each other. A driving current provided to the light-emitting element is controlled by the plurality of thin-film transistors.

SUMMARY

The disclosure provides a display device including pixels of which low gray scale performance is enhanced.

An embodiment of the inventive concept provides a display device including a display panel including a pixel including a pixel circuit and a light-emitting element connected to the pixel circuit. The pixel circuit includes a first thin-film transistor which includes a gate electrode connected to a first node, a first electrode, and a second electrode, and generates a driving current, a second thin-film transistor connected between the first electrode of the first thin-film transistor and a data line, a third thin-film transistor connected between the first node and the second electrode of the first thin-film transistor, a fourth thin-film transistor connected between the first node and an initialization voltage line, a fifth thin-film transistor connected between the first electrode of the first thin-film transistor and a first driving voltage line, a sixth thin-film transistor which is connected between the second electrode of the first thin-film transistor and the light-emitting element, and controls a transfer of the driving current, a first capacitor connected between the first node and the first driving voltage line, and a second capacitor connected between a gate electrode of the sixth thin-film transistor and the light-emitting element.

In an embodiment, each of the fifth thin-film transistor and the sixth thin-film transistor may be an n-channel metal-oxide semiconductor ("NMOS") thin-film transistor including an oxide semiconductor layer.

In an embodiment, each of the third thin-film transistor and the fourth thin-film transistor may be an NMOS thin-film transistor including an oxide semiconductor layer.

In an embodiment, each of the first thin-film transistor and the second thin-film transistor may be a p-channel metal-oxide semiconductor ("PMOS") thin-film transistor including a silicon semiconductor layer.

In an embodiment, the pixel may be provided in plural, and a plurality of pixels may include a first color pixel, a second color pixel, and a third color pixel. The first color pixel includes a first pixel circuit and a first light-emitting element connected with the first pixel circuit, the second color pixel includes a second pixel circuit and a second light-emitting element connected with the second pixel circuit, and the third color pixel includes a third pixel circuit and a third light-emitting element connected with the third pixel circuit, and the first color pixel provides red light, the second color pixel provides green light, and the third color pixel provides blue light.

In an embodiment, a first capacitance of the second capacitor of the first pixel circuit may be different from each of a second capacitance of the second capacitor of the second pixel circuit and a third capacitance of the second capacitor of the third pixel circuit.

In an embodiment, the second capacitance may be larger than each of the first capacitance and the third capacitance, and the first capacitance may be larger than the third capacitance.

In an embodiment, a capacitance of the second light-emitting element may be larger than each of those of the first light-emitting element and the third light-emitting element, and a capacitance of the first light-emitting element may be larger than that of the third light-emitting element.

In an embodiment, a first capacitance of the second capacitor of the first pixel circuit, a second capacitance of the second capacitor of the second pixel circuit, and a third capacitance of the second capacitor of the third pixel circuit may be substantially same.

In an embodiment, the second capacitor may include a first electrode connected to the gate electrode of the sixth thin-film transistor, and a second electrode connected to the light-emitting element. The second electrode of the second capacitor is disposed in a same layer as the gate electrode of the first thin-film transistor.

In an embodiment, the sixth thin-film transistor may include a semiconductor pattern, the gate electrode on the semiconductor pattern, a first connection electrode which is disposed on a plurality of insulation layers on the gate electrode and penetrates through the plurality of insulation layers to be connected to a first portion of the semiconductor pattern, and a second connection electrode which is disposed on the plurality of insulation layers and penetrates through the plurality of insulation layers to be connected to a second portion of the semiconductor pattern.

In an embodiment, the second capacitor may include a first electrode under the semiconductor pattern, and a second electrode under the first electrode of the second capacitor.

In an embodiment, a thickness of a gate insulation layer between the second electrode of the second capacitor and the first electrode of the second capacitor may be less than that of the plurality of insulation layers.

In an embodiment, the second electrode of the second capacitor may be electrically connected to the second connection electrode.

In an embodiment, the first capacitor may include a first electrode electrically connected to the first node, and a second electrode electrically connected to the first driving voltage line, and the second capacitor may include a third electrode electrically connected to the gate electrode of the sixth thin-film transistor and disposed in a same layer as the second electrode of the first capacitor, and a fourth electrode electrically connected with the light-emitting element and disposed in a same layer as the first electrode of the first capacitor.

In an embodiment of the inventive concept, a display device includes a display panel including a pixel including a pixel circuit and a light-emitting element connected to the pixel circuit. The pixel circuit includes a switching thin-film transistor which transfers a data signal according to a switching operation, a driving thin-film transistor which generates a driving current corresponding to the data signal, an NMOS-type light emission control thin-film transistor which is connected between the driving thin-film transistor and the light-emitting element, controls the transfer of the driving current, and includes an oxide semiconductor layer, and a compensation capacitor connected between a gate electrode of the NMOS-type light emission control thin-film transistor and the light-emitting element.

In an embodiment, the pixel may be provided in plural, and a plurality of pixels may include a first color pixel, a second color pixel, and a third color pixel. The first color pixel include a first pixel circuit and a first light-emitting element connected with the first pixel circuit, the second color pixel includes a second pixel circuit and a second light-emitting element connected with the second pixel circuit, and the third color pixel includes a third pixel circuit and a third light-emitting element connected with the third pixel circuit, and the first color pixel provides red light, the second color pixel provides green light, and the third color pixel provides blue light.

In an embodiment, a first capacitance of the compensation capacitor of the first pixel circuit, a second capacitance of the compensation capacitor of the second pixel circuit, and a third capacitance of the compensation capacitor of the third pixel circuit may be different from each other.

In an embodiment, a first capacitance of the compensation capacitor of the first pixel circuit, a second capacitance of the compensation capacitor of the second pixel circuit, and a third capacitance of the compensation capacitor of the third pixel circuit may be substantially same as each other.

In an embodiment, the NMOS-type light emission control thin-film transistor may include a semiconductor pattern, the gate electrode on the semiconductor pattern, a first connection electrode which is disposed on a plurality of insulation layers disposed on the gate electrode and penetrates through the plurality of insulation layers to be connected to a first portion of the semiconductor pattern, and a second connection electrode which is disposed on the plurality of insulation layers and penetrates through the plurality of insulation layers to be connected to a second portion of the semiconductor pattern, and the compensation capacitor may include a first electrode under the semiconductor pattern and a second electrode under the first electrode of the compensation capacitor.

In an embodiment of the inventive concept, a display device includes a display panel including a pixel including a pixel circuit and a light-emitting element connected to the pixel circuit. The pixel circuit includes first thin-film transistor including a gate electrode which is connected to a first node, a first electrode and a second electrode, and generates a driving current, a second thin-film transistor connected between the first electrode of the first thin-film transistor and a data line, a third thin-film transistor connected between the first node and the second electrode of the first thin-film transistor, a fourth thin-film transistor connected between the first node and an initialization voltage line, a fifth thin-film transistor connected between the first electrode of the first thin-film transistor and a first driving voltage line, a sixth thin-film transistor which is connected between the second electrode of the first thin-film transistor and the light-emitting element, and controls a transfer of the driving current, a first capacitor connected between the first node and the first driving voltage line, and a second capacitor connected between a gate electrode of the sixth thin-film transistor and the light-emitting element. Each of the third thin-film transistor and the fourth thin-film transistor is an NMOS thin-film transistor including an oxide semiconductor layer, and each of the first thin-film transistor and the second thin-film transistor is a PMOS thin-film transistor including a silicon semiconductor layer.

In an embodiment, each of the fifth thin-film transistor and the sixth thin-film transistor may be an NMOS thin-film transistor including an oxide semiconductor layer.

In an embodiment, the pixel may be provided in plural, and the plurality of pixels may include a first color pixel, a second color pixel, and a third color pixel. The first color pixel includes a first pixel circuit and a first light-emitting element connected with the first pixel circuit, the second color pixel includes a second pixel circuit and a second light-emitting element connected with the second pixel circuit, and the third color pixel includes a third pixel circuit and a third light-emitting element connected with the third pixel circuit, and the first color pixel provides red light, the second color pixel provides green light, and the third color pixel provides blue. A first capacitance of the second capacitor of the first pixel circuit is different from each of a second capacitance of the second capacitor of the second pixel circuit and a third capacitance of the second capacitor of the third pixel circuit.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
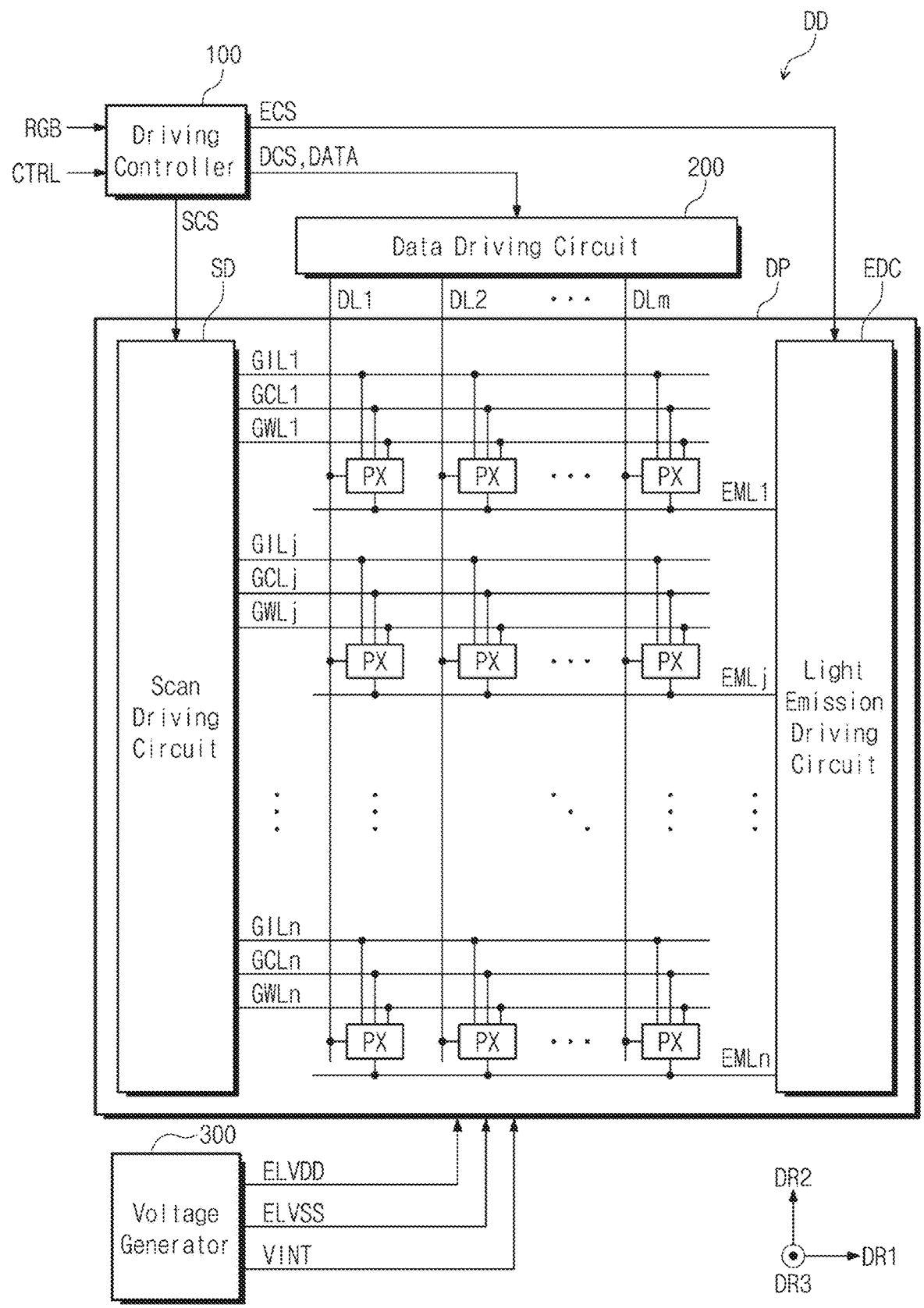
FIG. 1 is a block diagram of an embodiment of a display device according to the inventive concept.

It will be understood that when an element or layer is also referred to as being "on", "connected to" or "coupled to"

another element or layer, it may be directly on, connected or coupled to the other element or intervening third elements may be present.

Like reference numerals in the drawings refer to like elements. In addition, in the drawings, the thickness and the ratio and the dimension of the element are exaggerated for effective description of the technical contents. The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the present disclosure. The singular expressions include plural expressions unless the context clearly dictates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the drawing figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

FIG. 1 is a block diagram of an embodiment of a display device DD according to the inventive concept.

Referring to FIG. 1, the display device DD includes a display panel DP, a driving controller 100, a data driving circuit 200, and a voltage generator 300.

The driving controller 100 receives an input image signal RGB and a control signal CTRL. The driving controller 100 generates an output image signal DATA by converting a data format of the input image signal RGB so as to satisfy the specification of an interface with the data driving circuit 200. The driving controller 100 outputs a scan control signal SCS, a data driving signal DCS, and a light-emitting driving signal ECS.

The data driving circuit 200 receives the data driving signal DCS and the output image signal DATA from the driving controller 100. The data driving circuit 200 converts the output image signal DATA into data signals, and outputs the data signals to a plurality of data lines DL1 to DLm to be described below. Here, m is a natural number. The data signals are analog voltages corresponding to gray scale values of the output image signal DATA.

The voltage generator 300 generates voltages desired for an operation of the display panel DP. In this embodiment, the voltage generator 300 generates a first driving voltage ELVDD, a second driving voltage ELVSS, and an initialization voltage VINT.

The display panel DP includes scan lines GIL1 to GILn, GCL1 to GCLn, and GWL1 to GWLn, light emission control lines EML1 to EMLn, data lines DL1 to DLm, and pixels PX. Here, n is a natural number. The display panel DP may further include a scan driving circuit SD and a light emission driving circuit EDC. The scan lines GIL1 to GILn may be also referred to as initialization scan lines GIL1 to GILn, the scan lines GCL1 to GCLn may be also referred to as compensation scan lines GCL1 to GCLn, and the scan lines GWL1 to GWLn may be also referred to as writing scan lines GWL1 to GWLn.

The pixels PX may be disposed in a display area, and the scan driving circuit SD and the light emission driving circuit EDC may be disposed in a non-display area. However, the inventive concept is not limited thereto, and at least some of the pixels PX may overlap the scan driving circuit SD and the light emission driving circuit EDC. In this case, at least a portion of the scan driving circuit SD and at least a portion of the light emission driving circuit EDC may be disposed in the display area.

The scan driving circuit SD receives the scan driving signal SCS from the driving controller 100. In response to the scan driving signal SCS, the scan driving circuit SD may output the scan signals to the scan lines GIL1 to GILn, GCL1 to GCLn, and GWL1 to GWLn. The light emission driving circuit EDC receives a light emission driving signal ECS from the driving controller 100. In response to the light emission driving signal ECS, the light emission driving circuit EDC may output light emission control signals to the light emission control lines EML1 to EMLn.

The scan driving circuit SD is disposed in a first side (e.g., left side in FIG. 1) of the display panel DP. The scan lines GIL1 to GILn, GCL1 to GCLn, and GWL1 to GWLn extend in a first direction DR1 from the scan driving circuit SD. The light emission driving circuit EDC is disposed in a second side (e.g., right side in FIG. 1) of the display panel DP. However, the disclosure is not limited thereto, and the scan driving circuit SD and the light emission driving circuit EDC may be disposed in different sides. The light emission control lines EML1 to EMLn extend from the light emission driving circuit EDC in the opposite direction to the first direction DR1. Each of the scan lines GIL1 to GILn, GCL1 to GCLn, and GWL1 to GWLn, and each of the light emission control lines EML1 to EMLn are spaced apart from each other in a second direction DR2. The data lines DL1 to DLm extend from the data driving circuit 200 in the opposite direction to the second direction DR2, and are arranged to be spaced apart from each other in the first direction DR1. The third direction DR3 may be a direction intersecting with the first direction DR1 and the second direction DR2, and correspond to the thickness direction of the display panel DP.

In the example shown in FIG. 1, the scan driving circuit SD and the light emission driving circuit EDC are arranged to face each other with the pixels PX interposed therebetween, but the inventive concept is not limited thereto. In an embodiment, the scan driving circuit SD and the light emission driving circuit EDC may be disposed adjacent to any one of either the first side or the second side of the display panel DP, for example. In an embodiment, the scan driving circuit SD and the light emission driving circuit EDC may be configured as one circuit.

The display panel DP includes the scan lines GIL1 to GILn, GCL1 to GCLn, and GWL1 to GWLn, the light emission control lines EML1 to EMLn, and the data lines DL1 to DLm. Each of the plurality of pixels PX may be electrically connected to three scan lines, one light emission control line, and one data line. In an embodiment, as shown in FIG. 1, pixels in a first row may be connected to the scan lines GIL1, GCL1, and GWL1, and the light emission control line EML1, for example. In addition, pixels in a j-th row may be connected to the scan lines GILj, GCLj, and GWLj, and the light emission control line EMLj. In the illustrated embodiment, the plurality of pixels PX is disposed in a matrix form, but the disclosure is not limited thereto, and the plurality of pixels PX is disposed in various other forms.

Each of the plurality of pixels PX includes a light-emitting element ED (refer to FIG. 2), and a pixel circuit PXC (refer to FIG. 2) which controls the light emission of the light-emitting element ED. The pixel circuit PXC may include one or more thin-film transistors and one or more capacitors. The scan driving circuit SD and the light emission driving circuit EDC may include thin-film transistors provided through the same process as that of the pixel circuit PXC.

Each of the plurality of pixels PX receives the first driving voltage ELVDD, the second driving voltage ELVSS, and the initialization voltage VINT from the voltage generator 300.

Figure 2:
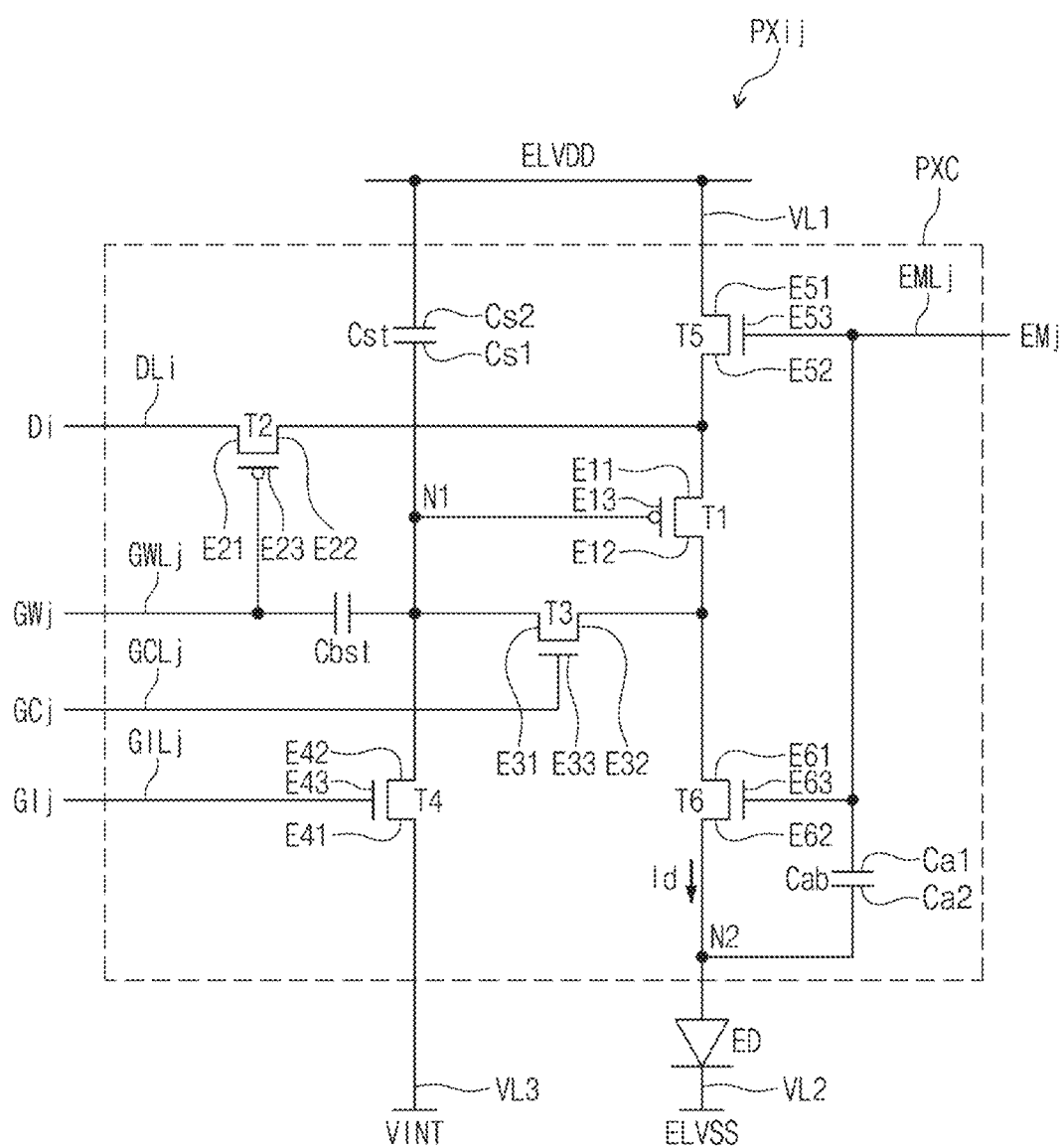
FIG. 2 is an equivalent circuit diagram of an embodiment of a pixel according to the inventive concept.

FIG. 2 is an equivalent circuit diagram of an embodiment of a pixel PXij according to the inventive concept.

Referring to FIGS. 1 and 2, an embodiment of the equivalent circuit diagram of the pixel PXij connected to an i-th data line DLi among the data lines DL1 to DLm, j-th scan lines GILj, GCLj, and GWLj among the scan lines GIL1 to GILn, GCL1 to GCLn, and GWL1 to GWLn, and a j-th light emission control line EMLj among the light emission control lines EML1 to EMLn. Each of the plurality of pixels PX shown in FIG. 1 may have the same circuit configuration as the equivalent circuit diagram of the pixel PXij shown in FIG. 2.

The pixel circuit PXC may include first to sixth thin-film transistors T1, T2, T3, T4, T5, and T6, a transfer capacitor Cst (also referred to as a first capacitor), a compensation capacitor Cab (also referred to as a second capacitor), and a boost capacitor Cbst. The pixel PXij shown in FIG. 2 is merely one of embodiments, and the configuration of the pixel circuit PXij may be modified in various ways. In an embodiment, the boost capacitor Cbst may be omitted, for example.

Each of the first and second thin-film transistors T1 and T2 may be a p-channel metal-oxide semiconductor ("PMOS") thin-film transistor including a silicon semiconductor layer. In an embodiment, each of the first and second thin-film transistors T1 and T2 may include a low-temperature polycrystalline silicon ("LTPS") semiconductor layer, for example. The first thin-film transistor T1 may be also referred to as a driving thin-film transistor, and the second thin-film transistor T2 may be also referred to as a switching thin-film transistor.

Each of the third to sixth thin-film transistors T3 to T6 may be an re-channel metal-oxide semiconductor ("NMOS") thin-film transistor including an oxide semiconductor layer. The third thin-film transistor T3 may be also referred to as a compensation thin-film transistor, the fourth thin-film transistor T4 may be also referred to as an initialization thin-film transistor, the fifth thin-film transistor T5 may be also referred to as a first light emission control thin-film transistor, and the sixth thin-film transistor T6 may be also referred to as a second light emission control thin-film transistor.

The scan lines GILj, GCLj, and GWLj may respectively transfer the scan signals GIj, GCj, and GWj, and the light emission control line EMLj may transfer the light emission control signal EMj. The data line DLi transfers a data signal Di. The data signal Di may have a voltage level corresponding to the input image signal RGB input to the display device DD.

The first to third driving voltage lines VL1 to VL3 may transfer the first driving voltage ELVDD, the second driving voltage ELVSS, and the initialization voltage VINT to the pixel PXij.

The first thin-film transistor T1 may include a first electrode E11 electrically connected to a first driving voltage line VL1 via the fifth transistor T5, a second electrode E12 electrically connected to an anode of the light-emitting diode ED via the sixth thin-film transistor T6, and a gate electrode E13. Although not shown in the drawing, the first thin-film transistor T1 may further include a back gate electrode.

The second thin-film transistor T2 includes a first electrode E21 connected to the data line DLi, a second electrode E22 connected to a first node N1, and a gate electrode E23 connected to the scan line GWLj. In response to the scan signal GWj received through the scan line GWLj, the second thin-film transistor T2 transfers the data signal Di received through the data line DLi to the first node N1.

The boost capacitor Cbst is connected between the gate electrode E23 of the second thin-film transistor T2 and the first node N1. When the scan signal GWj becomes a high level, the boost capacitor Cbst may serve to increase a voltage of the gate electrode E13 of the first thin-film transistor T1. In an embodiment of the inventive concept, the boost capacitor Cbst may be omitted.

The transfer capacitor Cst (or the first capacitor) is connected between the first node N1 and the first driving voltage line VL1. A first electrode Cs1 of the transfer capacitor Cst may be connected to the first node N1, and a second electrode Cs2 of the transfer capacitor Cst may be connected to the first driving voltage line VL1. The first electrode Cs1 of the transfer capacitor Cst may be also referred to as a first transfer electrode Cs1. The second electrode Cs2 of the transfer capacitor Cst may be also referred to as a second transfer electrode Cs2.

The third thin-film transistor T3 includes a first electrode E31 connected to the first node N1, a second electrode E32 connected to the second electrode E12 of the first thin-film transistor T1, and a gate electrode E33 connected to the scan line GCLj. The third thin-film transistor T3 may be turned on by the scan signal GCj received through the scan line GCLj.

The fourth thin-film transistor T4 includes a first electrode E41 connected to the third driving voltage line VL3 (or the initialization voltage line), a second electrode E42 connected to the first node N1, and a gate electrode E43 connected to the scan line GILj. In response to the scan signal GIj received through the scan line GILj, the fourth thin-film transistor T4 transfers the initialization voltage VINT received through the third driving voltage VL3 to the first node N1.

The fifth thin-film transistor T5 includes a first electrode E51 connected to the first driving voltage line VL1, a second electrode E52 connected to the first electrode E11 of the first thin-film transistor T1, and a gate electrode E53 connected to the light emission control line EMLj. The fifth transistor T5 may be turned on by the light emission control signal EM1j received through the light emission control line EMLj to electrically connect the first driving voltage line VL1 to the first electrode E11 of the first thin-film transistor T1.

The sixth thin-film transistor T6 includes a first electrode E61 connected to the second electrode E12 of the first thin-film transistor T1, a second electrode E62 connected to the light-emitting element ED, and a gate electrode E63 connected to the light emission control line EMLj. The sixth thin-film transistor T6 may be turned on by the light emission control signal EMj received through the light emission control line EMLj to transfer the driving current Id generated by the first thin-film transistor T1 to the light-emitting element ED.

The compensation capacitor Cab (or the second capacitor) is connected between the second node N2 and the gate electrode E63 of the sixth thin-film transistor T6. The first electrode Ca1 of the compensation capacitor Cab may be electrically connected to the gate electrode E63 of the sixth thin-film transistor T6, and the second electrode Ca2 of the compensation capacitor Cab may be connected to the anode N2, namely, the anode of the light-emitting element ED. In an embodiment of the inventive concept, the sixth thin-film transistor T6 may further include a back gate electrode disposed in a different layer from and electrically connected to the gate electrode E63. In this case, the first electrode Ca1 of the compensation capacitor Cab may be disposed in the same layer as the back gate electrode. The first electrode Ca1 of the compensation capacitor Cab may be also referred to as a third electrode Ca1 or a first compensation electrode Ca1, and the second electrode Ca2 of the compensation capacitor Cab may be also referred to as a fourth electrode Ca2 or a second compensation electrode Ca2.

The light-emitting element ED includes an anode connected to the second node N2 or the second electrode E62 of the sixth thin-film transistor T6, and a cathode connected to the second driving voltage line VL2.

In an embodiment of the inventive concept, the sixth thin-film transistor T6 is an NMOS thin-film transistor. Accordingly, when the light emission control signal EMj is dropped from a high level to a low level, the sixth thin-film transistor T6 is turned off. In this case, a voltage of the second node N2 may be lowered by coupling between the light emission control signal EMj and the anode of the light-emitting element ED. In other words, a waveform changes in the light emission control signal EMj for turning off the sixth thin-film transistor T6 may serve as a black current bypass. Accordingly, a brightness floating phenomenon in which an image having brightness higher than desired is displayed at a low gray scale may not occur.

In addition, when the light emission control signal EMj increases from a low level to a high level, the sixth thin-film transistor T6 is turned on. In this case, the voltage of the second node N2 may be increased by coupling between the light emission control signal EMj and the anode of the light-emitting element ED. This may generate a pre-charge effect, and the light-emitting element may emit light without a time delay when the low gray scale performance is implemented. Accordingly, in an embodiment of the inventive concept, the low gray scale performance of the display device DD may be enhanced.

In addition, as the sixth thin-film transistor T6 is provided as an NMOS thin-film transistor and the compensation capacitor Cab is provided between the anode of the light-emitting element ED and the gate electrode E63 of the sixth thin-film transistor T6, the initialization thin-film transistor for initialization according to the second node N2 may be omitted. Accordingly, the structure of the pixel circuit PXC may be further simplified. In addition, a gate low voltage is desired to be sufficiently lowered so as to drive the initialization thin-film transistor, but, as the initialization thin-film transistor is omitted, the level of the gate low voltage may be provided higher than the case where the initialization thin-film transistor is provided, and thus the consumption power may be reduced.

Figure 3:
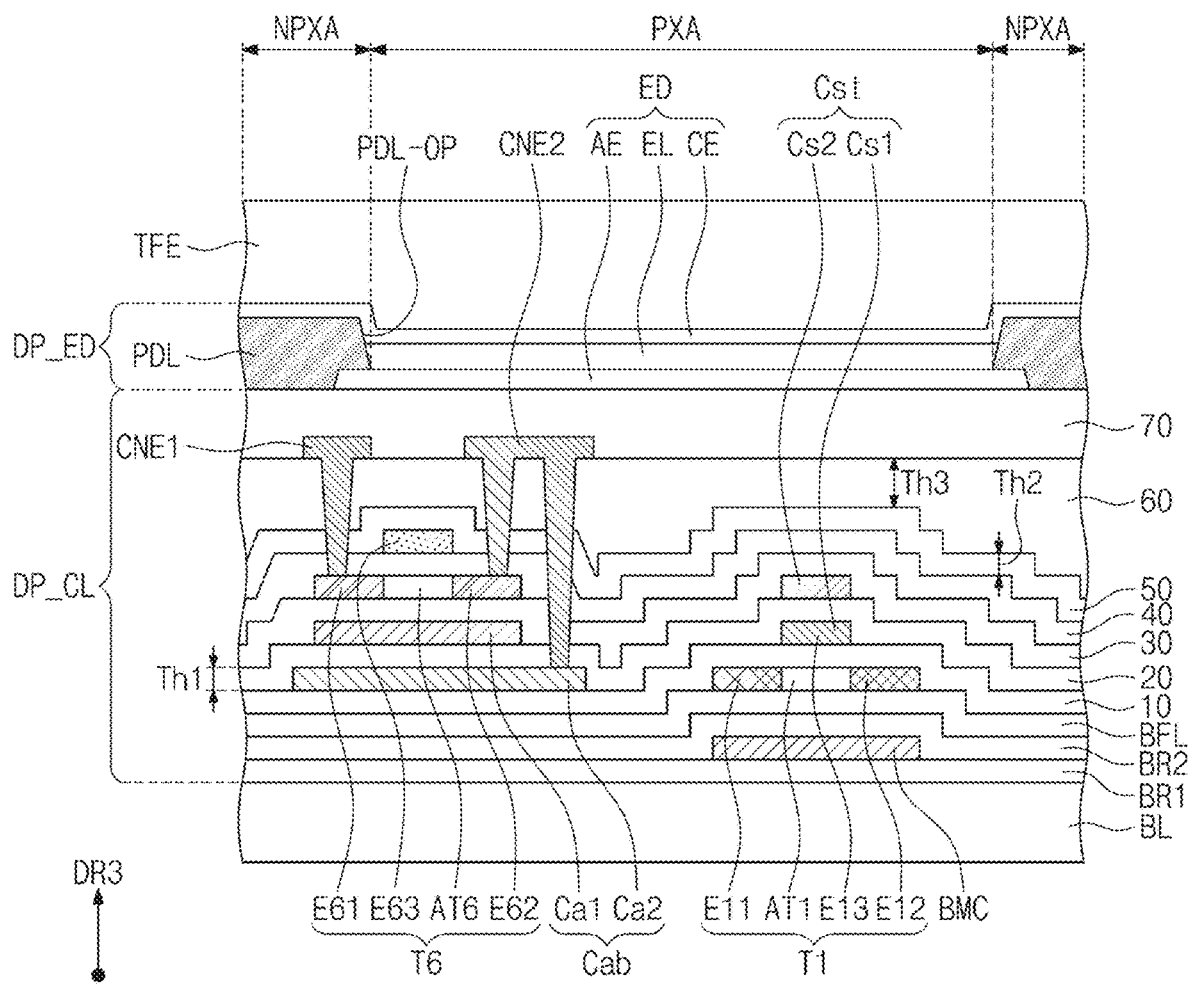
FIG. 3 is a cross-sectional view of an embodiment of a display device according to the inventive concept.

FIG. 3 is a cross-sectional view of the display device DD according to the inventive concept.

Referring to FIGS. 2 and 3, the display device DD may include a base layer BL, a circuit layer DP-CL disposed on the base layer BL, an element layer DP_ED, and an encapsulation layer TFE.

The base layer BL may include a synthetic resin layer. The synthetic resin layer may include a thermosetting resin. In particular, the synthetic resin layer may be a polyimide-based resin layer, but the material thereof is not particularly limited. The synthetic resin layer may include at least one among an acrylic-based resin, a methacrylic-based resin, polyisoprene, a vinyl-based resin, an epoxy-based resin, a urethane-based resin, a cellulose-based resin, a siloxane-based resin, a polyamide-based resin, or a parylene-based resin. Besides, the base layer BL may include a glass substrate, a metal substrate, or an organic/inorganic composite material substrate, etc.

At least one inorganic layer is provided on the top surface of the base layer BL. The inorganic layer may include at least any one among aluminum oxide, titanium oxide, silicon oxide, silicon oxynitride, zirconium oxide, or hafnium oxide. The inorganic layer may be provided with multilayer. The multilayer inorganic layers may configure barrier layers BR1 and BR2, and/or a buffer layer BFL to be described below. The barrier layers BR1 and BR2, and the buffer layer BFL may be selectively disposed.

The barrier layers BR1 and BR2 prevent a foreign matter from entering from the outside. The barrier layers BR1 and BR2 may include a silicon oxide layer and a silicon nitride layer. Each of them may be provided in plural, and the silicon oxide layers and the silicon nitride layers may be alternately laminated on each other.

The barrier layers BR1 and BR2 may include a first barrier layer BR1 and a second barrier layer BR2. A rear-surface metal layer BMC may be disposed between the first barrier layer BR1 and the second barrier layer BR2. In an embodiment of the inventive concept, the rear-surface metal layer BMC may be omitted.

The buffer layer BFL may be disposed on the barrier layers BR1 and BR2. The buffer layer BFL may enhance a bonding force between the base layer BL and a semiconductor pattern and/or a conductive pattern. The buffer layer BFL may include silicon oxide layers and silicon nitride layers. The silicon oxide layers and the silicon nitride layers may be alternately laminated on each other.

A first semiconductor pattern may be disposed on the buffer layer BFL. The first semiconductor pattern may include silicon semiconductor. In an embodiment, the silicon semiconductor may include amorphous silicon, polycrystalline silicon, or the like, for example. In an embodiment, the first semiconductor pattern may include low temperature polysilicon, for example.

FIG. 3 only illustrates a portion of the first semiconductor pattern disposed on the buffer layer BFL, and a first semiconductor pattern may be further disposed in another area. The first semiconductor pattern may be arrayed across pixels according to predetermined rules. The first semiconductor pattern may have different electrical properties according to whether it is doped or not. The first semiconductor pattern may include a first area having high conductivity and a second area having low conductivity. The first area may be doped with an N-type dopant or a P-type dopant. A P-type thin-film transistor includes a doped region doped with a P-type dopant, and an N-type thin-film transistor includes a doped area doped with an N-type dopant. The second area may be a non-doped area, or be doped at a lower concentration in comparison to the first area.

The first area may have greater conductivity than that of the second area, and substantially serve as an electrode or a signal line. The second area may substantially correspond to an active area (or a channel) of a thin-film transistor. In other words, a portion of the semiconductor pattern may be the active area of the thin-film transistor, another portion may be a source or a drain, and still another portion may be a connection electrode or a signal connection line.

A first electrode E11, a channel AT1, and a second electrode E12 of the first thin-film transistor T1 are provided from the first semiconductor pattern. The first electrode E11 and the second electrode E12 of the first thin-film transistor T1 extend in opposite directions from the channel AT1.

The first insulation layer 10 may be disposed on the buffer layer BFL. The first insulation layer 10 may commonly overlap the plurality of pixels and cover the first semiconductor pattern. The first insulation layer 10 may include an inorganic material and/or organic material, and have a single layer or multilayer structure. The first insulation layer 10 may include at least one among aluminum oxide, titanium oxide, silicon oxide, silicon nitride, silicon oxynitride, zirconium oxide, or hafnium oxide. In the illustrated embodiment, the first insulation layer 10 may be a single silicon oxide layer. Not only the first insulation layer 10, but also an insulation layer of the circuit layer DP_CL to be described below may include an inorganic material layer and/or an organic material layer, and have a single layer or multilayer structure. The inorganic material layer may include at least one among the foregoing materials, but is not limited thereto.

The gate electrode E13 of the first thin-film transistor T1 may be disposed on the first insulation layer 10. The gate electrode E13 may be a portion of a metal pattern. The gate electrode E13 of the first thin-film transistor T1 overlaps the channel AT1 of the first thin-film transistor T1. In a process for doping the first semiconductor pattern, the gate electrode E13 of the first thin-film transistor T1 may function as a mask. The gate electrode E13 may include titanium (Ti), silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), indium tin oxide ("ITO"), indium zinc oxide ("IZO"), or the like, but is not particularly limited thereto.

The second electrode Ca2 of the compensation capacitor Cab may be disposed on the first insulation layer 10. Another portion connected to the gate electrode E13 of the first thin-film transistor T1 may be a first electrode Cs1 of the transfer capacitor Cst. The second electrode Ca2 of the compensation capacitor Cab may be disposed in the same layer as the gate electrode E13 of the first thin-film transistor T1 and the first electrode Cs1 of the transfer capacitor Cst.

The second insulation layer 20 may be disposed on the first insulation layer 10 and cover the gate electrode E13 of the first thin-film transistor T1. The second insulation layer 20 may include an inorganic material and/or organic material, and have a single layer or multilayer structure. The second insulation layer 20 may include at least one among silicon oxide, silicon nitride, or silicon oxynitride. In the illustrated embodiment, the second insulation layer 20 may have a multilayer structure including a silicon oxide layer and a silicon nitride layer.

The second electrode Cs2 of the transfer capacitor Cst and the first electrode Ca1 of the compensation capacitor Cab may be disposed on the second insulation layer 20. The second electrode Cs2 may overlap the gate electrode E13. The second electrode Cs2 of the second transfer capacitor Cst may be a portion of the metal pattern. A portion of the gate electrode E13 and the second electrode Cs2, overlapping therewith, of the transfer capacitor Cst may define the transfer capacitor Cst. The first electrode Ca1 of the compensation capacitor Cab may be a portion of the metal pattern. The first electrode Ca1 and the second electrode Ca2 overlapping therewith may define the compensation capacitor Cab.

In an embodiment of the inventive concept, the second insulation layer 20 may be replaced with an insulation pattern. In this case, an upper electrode may be disposed on the insulation pattern, and the upper electrode may serve as a mask which provides the insulation pattern from the second insulation layer 20.

A third insulation layer 30 may be disposed on the second insulation layer 20, and cover the second electrode Cs2 of the transfer capacitor Cst and the first electrode Ca1 of the compensation capacitor Cab. The third insulation layer 30 may have a single layer or multilayer structure. In an embodiment, the third insulation layer 30 may have a multilayer structure including a silicon oxide layer and a silicon nitride layer, for example.

The second semiconductor pattern may be disposed on the third insulation layer 30. The second semiconductor pattern may include silicon oxide semiconductor. The silicon oxide semiconductor may include a plurality of areas divided according to whether a metal oxide is reduced. An area (hereinafter, reduction area) in which the metal oxide is reduced has high conductivity in comparison to an area (hereinafter, non-reduction area) in which the metal oxide is not reduced. The reduction area may substantially serve as a source/drain or a signal line of a thin-film transistor. The non-reduction area substantially corresponds to the active area (or a semiconductor area or a channel) of the thin-film transistor. In other words, a portion of the second semiconductor pattern may be the active area of the thin-film transistor, another portion may be a source/drain area of the thin-film transistor, and still another portion may be a signal transfer area.

A first electrode E61, a channel AT6, and a second electrode E62 of the sixth thin-film transistor T6 are provided from the second semiconductor pattern. The first electrode E61 may be also referred to as a first portion of the second semiconductor pattern, and the second electrode E62 may be also referred to as a second portion of the second semiconductor pattern. The first electrode E61 and the second electrode E62 may include a metal reduced from a metal-oxide-semiconductor.

The first electrode E61 and the second electrode E62 may extend in opposite directions from the channel AT6 on a cross section.

A fourth insulation layer 40 may be disposed on the third insulation layer 30. The fourth insulation layer 40 may commonly overlap the plurality of pixels and cover the second semiconductor pattern. The fourth insulation layer 40 may include at least one among aluminum oxide, titanium oxide, silicon oxide, silicon nitride, silicon oxynitride, zirconium oxide, or hafnium oxide.

The gate electrode E63 of the sixth thin-film transistor T6 may be disposed on the fourth insulation layer 40. The gate electrode E63 may be a portion of the metal pattern. The gate electrode E63 of the sixth thin-film transistor T6 may overlap the channel AT6 of the sixth thin-film transistor T6. The gate electrode E63 may function as a mask in a process for reducing the second semiconductor pattern. In an embodiment of the inventive concept, the fourth insulation layer 40 may be replaced with an insulation pattern.

The fifth insulation layer 50 may be disposed on the fourth insulation layer 40 and cover the gate electrode E63. The fifth insulation layer 50 may be an inorganic layer.

A sixth insulation layer 60 may be disposed on the fifth insulation layer 50. The sixth insulation layer 60 may be an organic layer. The organic layer may include a general purpose polymer such as benzocyclobutene ("BCB"), polyimide, hexamethyldisiloxane ("HMDSO"), or polystyrene ("PS"), a polymer derivative having a phenolic group, an acrylic-based polymer, an imide-based polymer, an arylene ether-based polymer, an amide-based polymer, a fluorinated polymer, a p-xylene-based polymer, a vinyl alcohol-based polymer, or any combinations thereof, but is not particularly limited thereto.

A first connection electrode CNE1 may be disposed on the sixth insulation layer 60. The first connection electrode CNE1 may be connected to the first electrode E61 through a contact hole penetrating through the fourth to sixth insulation layers 40, 50 and 60.

A second connection electrode CNE2 may be disposed on the sixth insulation layer 60. The second connection electrode CNE2 may be connected to the second connection electrode E62 through a first contact hole penetrating through the fourth to sixth insulation layers 40, 50 and 60. In addition, the second connection electrode CNE2 may be connected to the second electrode Ca2 of the compensation capacitor Cab through a second contact hole penetrating through the second to sixth insulation layers 20, 30, 40, 50 and 60.

The fifth and sixth insulation layers 50 and 60 may be also referred to as a plurality of insulation layers 50 and 60. The second insulation layer 20 may be also referred to as a gate insulation layer 20. The maximum thickness Th1 of the gate insulation layer 20 may be less than a minimum thickness Th2 or Th3 of each of the plurality of insulation layers 50 and 60 in the third direction DR3. The second electrode Ca2 of the compensation capacitor Cab may face the first electrode Ca1 of the compensation capacitor Cab with the gate insulation layer 20 interposed therebetween, and be electrically connected to the second connection electrode CNE2. The first electrode Ca1 of the compensation capacitor Cab may be electrically connected to the gate electrode E63. The gate insulation layer 20 having a relatively less thickness may be used as an insulation film of the compensation capacitor Cab. Accordingly, in comparison with a case where the plurality of insulation layers 50 and 60 is used as the insulation film of the compensation capacitor Cab, the respective areas of the first electrode Ca1 and the second electrode Ca2 of the compensation capacitor Cab may be reduced.

A seventh insulation layer 70 may be disposed on the sixth insulation layer 60, and cover the first connection electrode CNE1 and the second connection electrode CNE2. The seventh insulation layer 70 may be an organic layer.

A first electrode layer is disposed on the circuit layer DP-CL. A pixel definition layer PDL is provided on the first electrode layer. The first electrode layer may include an anode AE. The anode AE is disposed on the seventh insulation layer 70.

The element layer DP_ED may be disposed on the circuit layer DP_CL. The element layer DP_ED may include a light-emitting element ED. In an embodiment, the element layer DP_ED may include an organic light-emitting material, an inorganic light-emitting material, an organic-inorganic light-emitting material, a quantum dot, a quantum rod, a micro light-emitting diode ("micro-LED"), or a nano-LED, for example. Hereinbelow, the element layer DP_ED is described as an embodiment of the organic light-emitting element, but is not particularly limited thereto. The light-emitting element ED may include the anode AE (or a first electrode), a light-emitting layer EL, and a cathode CE (or a second electrode).

The pixel definition layer PDL may be disposed on the seventh insulation layer 70 and cover a portion of the anode AE. In an embodiment, an opening PDL-OP is provided in the pixel definition layer PDL, for example. The opening PDL-OP exposes at least a portion of the anode AE. In an embodiment of the inventive concept, the pixel definition layer PDL may further include a black material. The pixel definition layer PDL may further include a black organic dye/pigment such as carbon black, or aniline black. The pixel definition layer PDL may be provided with a combination of a blue organic material and a black organic material. The pixel definition layer PDL may further include a lyophobic organic material.

As shown in FIG. 3, the display device DD may include a light-emitting area PXA and a non-light-emitting area NPXA adjacent to the light-emitting area PXA. The non-light-emitting area NPXA may surround the light-emitting area PXA. In the illustrated embodiment, the light-emitting area PXA is defined in correspondence to a partial area of the anode AE exposed by the opening PDL-OP.

The light-emitting layer EL may be disposed on the anode AE. The light-emitting layer EL may be disposed in an area corresponding to the opening PDL-OP. In an embodiment, the light-emitting layer EL may be separately provided to each of the plurality of pixels PX (refer to FIG. 1), for example. In the illustrated embodiment, the patterned light-emitting layer EL is described in an embodiment, but one light-emitting layer may be commonly disposed in the plurality of light-emitting areas. Here, the light-emitting layer may generate white light or blue light. In addition, the light-emitting layer may have a multilayer structure referred to as tandem.

The light-emitting layer EL may include an organic material and/or an inorganic material. The light-emitting layer EL may include, as a light-emitting material, a low molecular organic material or a high molecular organic material. In an alternative embodiment, the light-emitting layer EL may include a quantum dot as a light-emitting material. The core of the quantum dot may be selected from among a group II-VI compound, a group III-V compound, a group IV-VI compound, a group IV element, a group IV compound, or any combinations thereof.

The cathode CE is disposed on the light-emitting layer EL. As an embodiment of the inventive concept, the cathode CE may be commonly disposed in the light-emitting areas PXA and the non-light-emitting area NPXA.

An encapsulation layer TFE may be disposed on the element layer DP_ED. The encapsulation layer TFE includes at least an inorganic layer or an organic layer. In an embodiment of the inventive concept, the encapsulation layer TFE may include two inorganic layers and an organic layer interposed therebetween. In an embodiment of the inventive concept, a thin-film encapsulation layer may include a plurality of inorganic layers and a plurality of organic layer that are alternately laminated on each other.

Figure 4A:
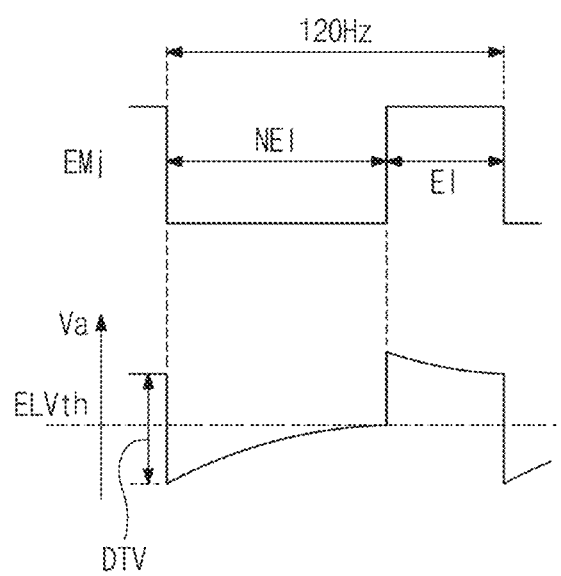
FIG. 4A illustrates the waveform of an embodiment of a light emission control signal and a voltage of a second node according to the inventive concept.
Figure 4B:
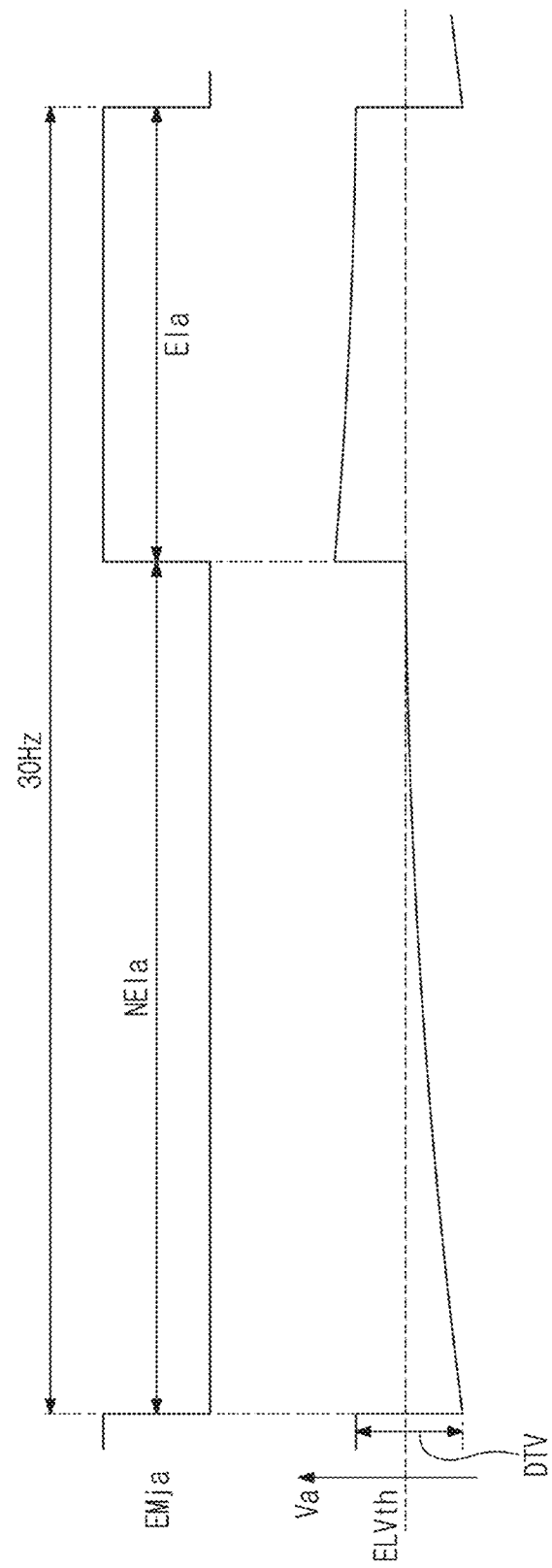
FIG. 4B illustrates the waveform of an embodiment of the light emission control signal and the voltage of the second node according to the inventive concept.

FIG. 4A illustrates the waveform of an embodiment of a light emission control signal and a voltage of a second node according to the inventive concept. FIG. 4B illustrates the waveform of an embodiment of the light emission control signal and the voltage of the second node according to the inventive concept.

FIG. 4A illustrates the waveform of the light emission signal EMj operating at about 120 hertz (Hz) and the waveform of the voltage Va of the second node N2, and FIG. 4B illustrates the waveform of the light emission signal EMja operating at about 30 Hz and the waveform of the voltage Va of the second node N2.

Referring to FIGS. 2 and 4A, each of the fifth and sixth thin-film transistors T5 and T6 is an NMOS thin-film transistor. Accordingly, when the light emission control signal EMj is at a low level, the fifth and sixth thin-film transistors T5 and T6 may be turned off. An interval in which the light emission control signal EMj is at the low level may be also referred to as a non-light emission interval NEI. When the light emission control signal EMj is at a high level, the fifth and sixth thin-film transistors T5 and T6 may be turned on. An interval in which the light emission control signal EMj is at the high level may be also referred to as a light emission interval EI.

When the light emission control signal EMj is dropped from a high level to a low level, the sixth thin-film transistor T6 is turned off. In this case, the voltage of the second node N2 may be lowered by coupling between the light emission control signal EMj and the anode of the light-emitting element ED. In other words, a waveform changes in the light emission control signal EMj for turning off the sixth thin-film transistor T6 may serve as a black current bypass. A change amount DTV of a voltage may be expressed as $\Delta Vem*(Cgd+Abst)/(Cgd+Abst+Cel)$, where $\Delta Vem$ denotes a voltage difference between a high level and a low level of the light emission control signal EMj, Cgd denotes the gate-drain capacitance of the sixth thin-film transistor T6, namely, the capacitance between the gate electrode E63 and the second electrode E62, Abst denotes the capacitance of the compensation capacitor Cab, and Cel denotes the capacitance of the light-emitting element ED.

The magnitude of the capacitance of the compensation capacitor Cab may be determined on the basis of the change amount DTV of a desired voltage. In an embodiment, the magnitude of the capacitance of the compensation capacitor Cab may be determined so that the voltage Va of the second node N2 does not exceed a light emission threshold voltage ELVth of the light-emitting element ED, even when the voltage Va increases during the non-light emission interval, for example. In an embodiment, $\Delta Vem$ may be about 15 volts (V), Cgd may be about 2.5 femtofarads (fF), and Cel may be about 72.5 fF. In consideration of the foregoing, Abst may be determined as about 15.6 fF so that $\Delta Va$ is adjusted to about 3.0 V. For reference, the capacitance of the first capacitor Cst may be about 70 fF, for example. Accordingly, the compensation capacitor Cab of about 15.6 fF may be sufficiently implemented within a limited pixel space.

Referring to FIGS. 2 and 4B, a driving frequency may be about 30 Hz in an always-on display ("AOD") mode. In this case, the lengths of the non-light-emitting interval NEIa and the light-emitting interval EIa may be respectively longer than the lengths of the non-light-emitting interval NEI (refer to FIG. 4A) and the light-emitting interval EI (refer to FIG. 4A).

Unlike the embodiment of the inventive concept, when the sixth thin-film transistor T6 is a PMOS thin-film transistor, the voltage Va of the second node N2 may exceed the light emission threshold voltage ELVth during the non-light-emitting interval NEIa. In this case, a phenomenon that the brightness floats in the non-light-emitting interval NEIa may occur. However, in the embodiment of the inventive concept, the voltage change amount DTV is adjusted using the compensation capacitor Cab connected between the sixth thin-film transistor T6 and the light-emitting element ED. Therefore, the brightness floating phenomenon may not occur in the non-light-emitting interval NEIa. In addition, even when the brightness floats, an interval in which the brightness floats may be shorter when the sixth thin-film transistor T6 is an NMOS thin-film transistor than a case where the sixth thin-film transistor T6 is a PMOS thin-film transistor.

Figure 5:
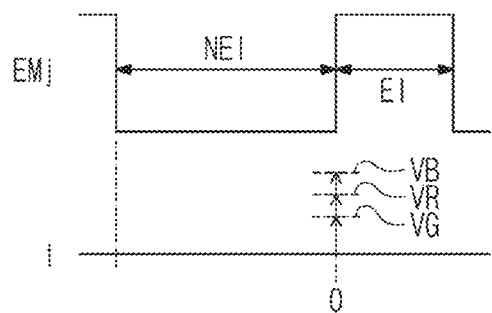
FIG. 5 illustrates a waveform diagram of an embodiment of the light emission control signal and a change in the voltage of the second node according to the inventive concept.

FIG. 5 illustrates a waveform diagram of an embodiment of the light emission control signal and a change in the voltage of the second node according to the inventive concept.

Referring to FIGS. 2 and 5, when the light emission control signal EMj increases from a low level to a high level, the sixth thin-film transistor T6 is turned on. In this case, the voltage of the second node N2 may be raised by coupling between the light emission control signal EMj and the anode of the light-emitting element ED. This may generate a pre-charge effect, and the light-emitting element ED may emit light without a time delay when the low gray scale performance is implemented.

Each of the first to third voltages VR, VG, and VB shown in FIG. 5 may be the voltage of the second node N2. The voltage of the second node N2 of a red light-emitting element is a first voltage CR, the voltage of the second node N2 of a green light-emitting element is a second voltage VG, and the voltage of the second node N2 of a blue light-emitting element is a third voltage VB.

According to whether the light-emitting element ED is a light-emitting element of red, green, or blue, the first to third voltages VR, VG, and VB may be different. In an embodiment, the light-emitting element ED may have a different capacitance according to the color of emitted light, for example. Accordingly, coupling of the green light-emitting element ED having a relatively large capacitance may be relatively smaller, and coupling of the blue light-emitting element ED having a relatively small capacitance may be relatively large. Therefore, the change amount of the third voltage VB may be the largest, the change amount of the first voltage VR may be the next, and the change amount of the second voltage VG may be the smallest.

Figure 6A:
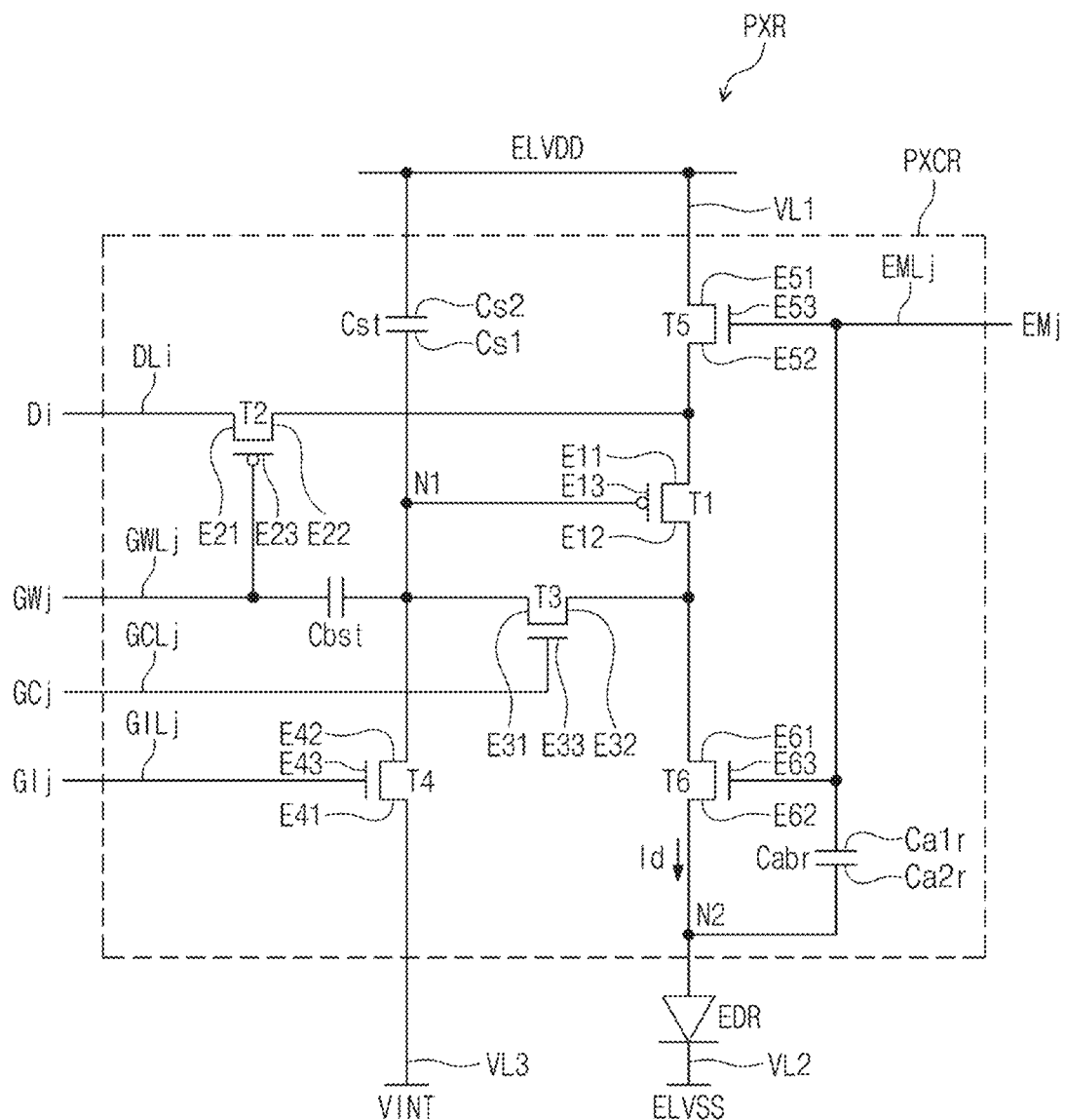
FIG. 6A is an equivalent circuit diagram of an embodiment of a first color pixel according to the inventive concept.
Figure 6B:
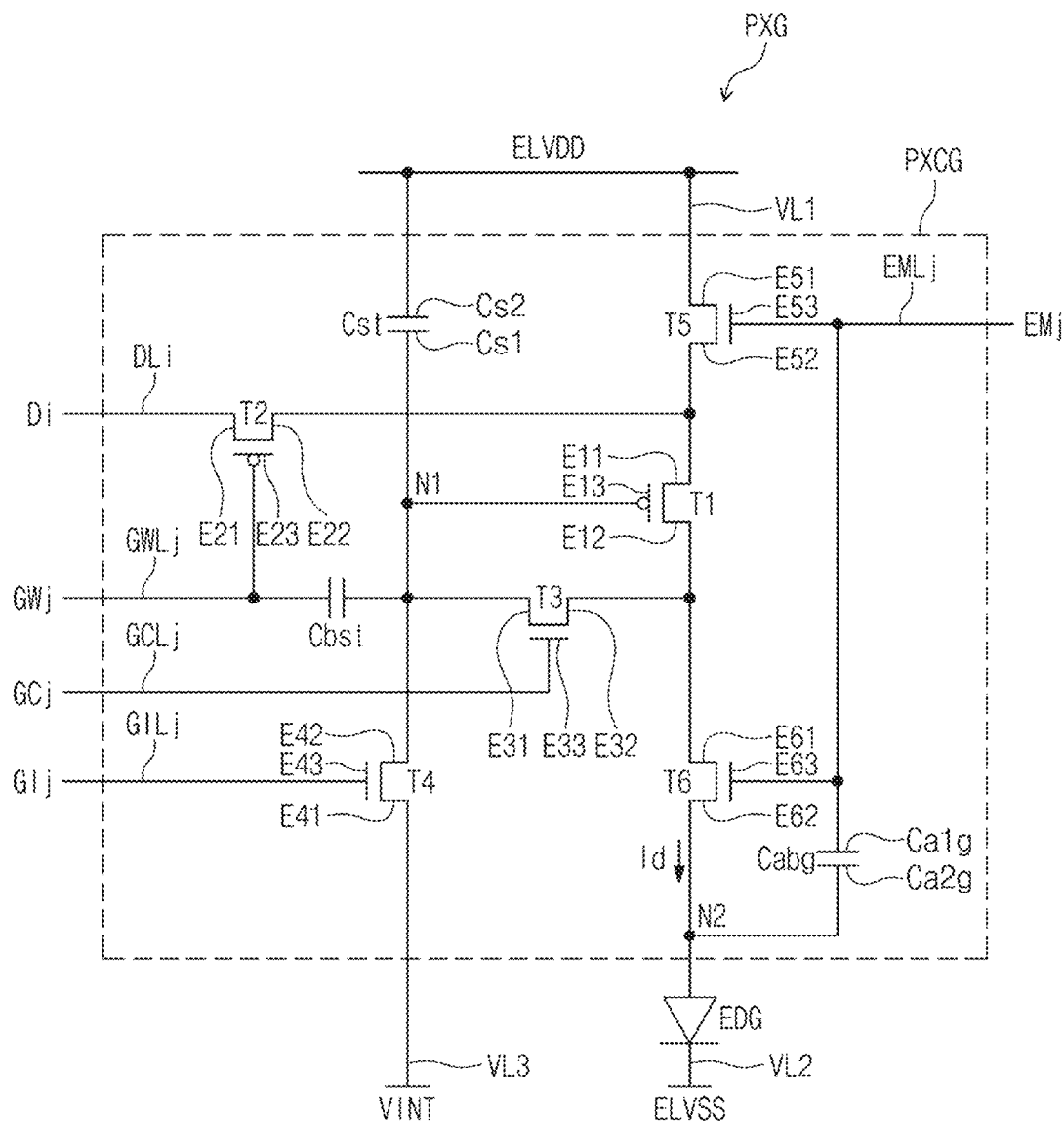
FIG. 6B is an equivalent circuit diagram of an embodiment of a second color pixel according to the inventive concept.
Figure 6C:
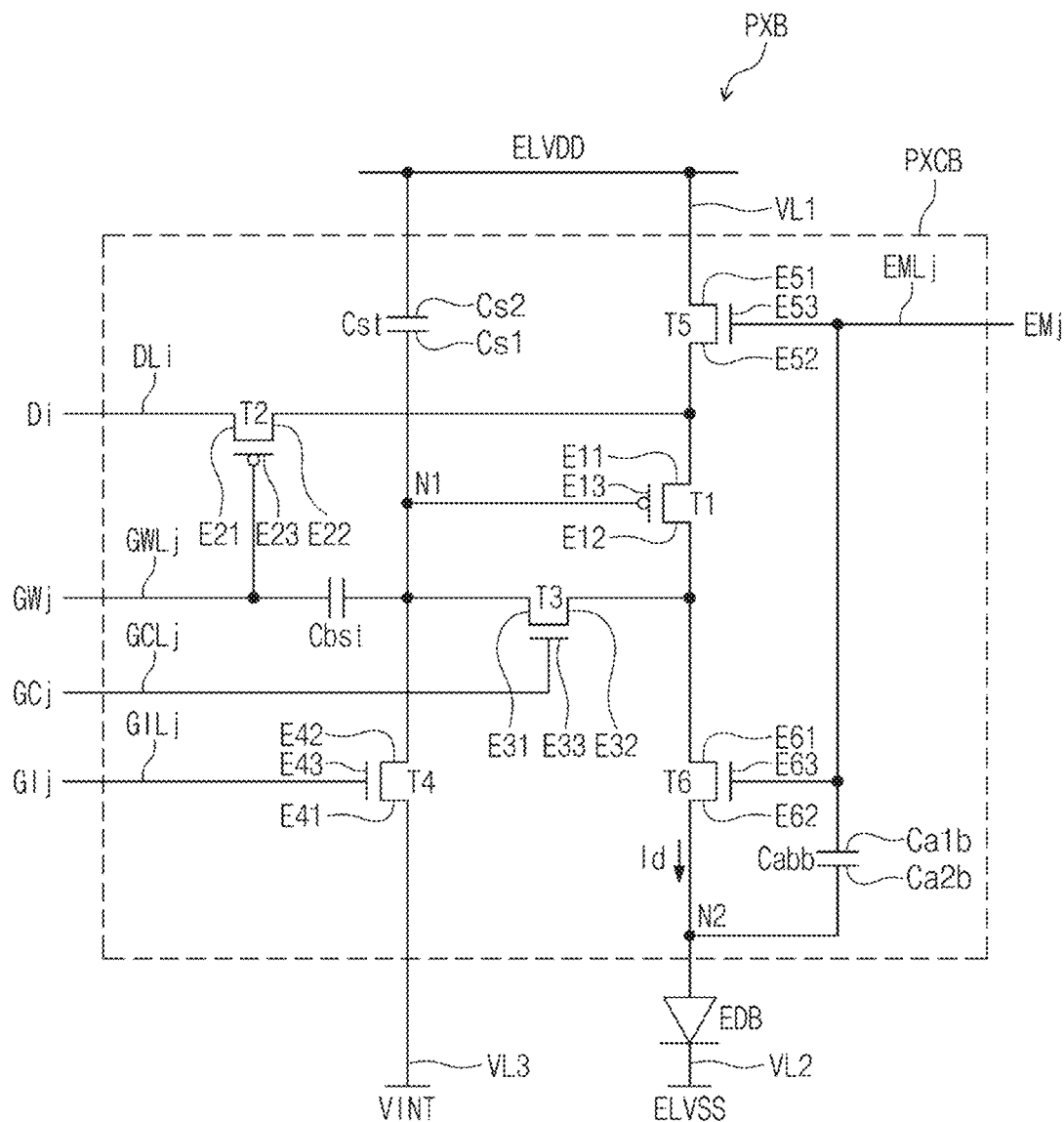
FIG. 6C is an equivalent circuit diagram of an embodiment of a third color pixel according to the inventive concept.

FIG. 6A is an equivalent circuit diagram of an embodiment of a first color pixel according to the inventive concept. FIG. 6B is an equivalent circuit diagram of an embodiment of a second color pixel according to the inventive concept. FIG. 6C is an equivalent circuit diagram of an embodiment of a third color pixel according to the inventive concept.

Referring to FIGS. 1, 6A, 6B, and 6C, the plurality of pixels PX may include a first color pixel PXR, a second color pixel PXG, and a third color pixel PXB. The first color pixel PXR may include a first pixel circuit PXCR and a first light-emitting element EDR connected to the first pixel circuit PXCR. The second color pixel PXG may include a second pixel circuit PXCG and a second light-emitting element EDG connected to the second pixel circuit PXCG.

The third color pixel PXB may include a third pixel circuit PXCB and a third light-emitting element EDB connected to the third pixel circuit PXCB. The first color pixel PXR may provide red light, the second color pixel PXG may provide green light, and the third color pixel PXB may provide blue light.

The capacitances of the first to third light-emitting elements EDR, EDG, and EDB may be different from each other. In an embodiment, the capacitance of the second light-emitting element EDG may be larger than each of the capacitances of the first light-emitting element EDR and the third light-emitting element EDB, for example. The capacitance of the first light-emitting element EDR may be larger than that of the third light-emitting element EDB.

In consideration of the capacitances of the first to third light-emitting elements EDR, EDG and EDB, the capacitances of the second capacitors Cabr, Cabg and Cabb may be made different from each other. In an embodiment, a first capacitance of the second capacitor Cabr of the first pixel circuit PXCR may be different from each of a second capacitance of the second capacitor Cabg of the second pixel circuit PXCG and a third capacitance of the second capacitor Cabb of the third pixel circuit PXCB, for example. The second capacitance of the second capacitor Cabg may be larger than each of the first capacitance of the second capacitor Cabr and the third capacitance of the second capacitor Cabb, and the first capacitance of the second capacitor Cabr may be larger than the third capacitance of the second capacitor Cabb.

The areas that first electrodes Ca1r, Ca1g and Ca1b of the second capacitors Cabr, Cabg and Cabb respectively overlap second electrodes Ca2r, Ca2g and Ca2b of the second capacitors Cabr, Cabg and Cabb may be different from each other. In an embodiment, the area that the first electrode Ca1g overlaps the second electrode Ca2g is the largest, the area that the first electrode Ca1r overlaps the second electrode Ca2r is the next, and the area that the first electrode Ca1b overlaps the second electrode Ca2b is the smallest, for example. However, this is just an example, and the inventive concept is not particularly limited thereto.

Figure 7:
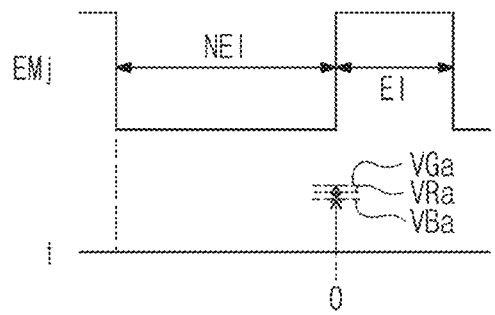
FIG. 7 illustrates a waveform diagram of an embodiment of the light emission control signal and a change in the voltage of the second node according to the inventive concept.

FIG. 7 illustrates a waveform diagram of an embodiment of the light emission control signal and a change in the voltage of the second node according to the inventive concept.

Referring to FIGS. 6A to 6C, and FIG. 7, the capacitances of the second capacitors Cabr, Cabg and Cabb respectively connected to the first to third light-emitting elements EDR, EDG and EDB may be individually adjusted. In an embodiment, the capacitances of the second capacitors Cabr, Cabg and Cabb may have different values, for example.

Each of the first to third voltages VRa, VGa, and VBa may be the voltage of the second node N2. When the light emission control signal EMj increases from a low level to a high level, the sixth thin-film transistor T6 is turned on. In this case, the voltages of the second nodes N2 may be raised by coupling between the light emission control signal EMj and the anodes of the light-emitting elements EDR, EDG and EDB. This may generate a pre-charge effect, and the first to third light-emitting elements EDR, EDG and EDB may emit light without a time delay when the low gray scale performance is implemented.

The difference between the capacitances of the first to third light-emitting elements EDR, EDG and EDB may cause color break-up and color difference at low brightness. In an embodiment of the inventive concept, the difference between the capacitances of the first to third light-emitting elements EDR, EDG and EDB may be compensated with the difference between the capacitances of the second capacitors Cabr, Cabg and Cabb. The differences between the first to third voltages VRa, VGa and VBa shown in FIG. 7 may be smaller than those between the first to third voltages CR, VG and VB shown in FIG. 5. Accordingly, the color break-up and the color difference at low brightness caused by the difference in voltage change amount may be reduced or removed by adjusting the capacitances of the second capacitors Cabr, Cabg and Cabb.

According to the foregoing description, the pixel circuit may include first to sixth thin-film transistors, and a compensation capacitor connected between the gate electrode and the light-emitting element of the sixth thin-film transistor. The sixth thin-film transistor is an NMOS thin-film transistor. When a light emission control signal to be provided to the gate electrode of the sixth thin-film transistor is dropped from a high level to a low level, the sixth thin-film transistor is turned off. In this case, the voltage of the anode of the light-emitting element may be lowered by coupling between the light emission control signal and the anode of the light-emitting element. In other words, a waveform changes in the light emission control signal for turning off the sixth thin-film transistor may serve as a black current bypass. In addition, when the light emission control signal increases from a low level to a high level, the sixth thin-film transistor is turned on. In this case, the light emission control signal and the voltage of the anode of the light-emitting element may increase by coupling between the light emission control signal and the anode of the light-emitting element. Accordingly, a pre-charge effect may be generated, and the light-emitting element may emit light without a time delay when the low gray scale performance is implemented.

Although the embodiments of the invention have been described, it is understood that the invention should not be limited to these embodiments but various changes and modifications may be made by one ordinary skilled in the art within the spirit and scope of the invention as hereinafter claimed.

What is claimed is:
1. A display device comprising:
a display panel comprising:
a pixel comprising:
a pixel circuit comprising:
a first thin-film transistor which comprises a gate electrode connected to a first node, a first electrode, and a second electrode, and generates a driving current;
a second thin-film transistor connected between the first electrode of the first thin-film transistor and a data line;
a third thin-film transistor connected between the first node and the second electrode of the first thin-film transistor;
a fourth thin-film transistor connected between the first node and an initialization voltage line;
a fifth thin-film transistor connected between the first electrode of the first thin-film transistor and a first driving voltage line;
a sixth thin-film transistor which controls a transfer of the driving current;
a first capacitor connected between the first node and the first driving voltage line; and
a second capacitor; and
a light-emitting element connected to the pixel circuit, wherein
  the sixth thin-film transistor is connected between the second electrode of the first thin-film transistor and the light-emitting element, and
  the second capacitor is connected between a gate electrode of the sixth thin-film transistor and the light-emitting element.

2. The display device of claim 1, wherein each of the fifth thin-film transistor and the sixth thin-film transistor is an n-channel metal-oxide semiconductor ("NMOS") thin-film transistor including an oxide semiconductor layer.

3. The display device of claim 1, wherein each of the third thin-film transistor and the fourth thin-film transistor is an NMOS thin-film transistor including an oxide semiconductor layer.

4. The display device of claim 1, wherein each of the first thin-film transistor and the second thin-film transistor is a p-channel metal-oxide semiconductor ("PMOS") thin-film transistor including a silicon semiconductor layer.

5. The display device of claim 1, wherein the pixel is provided in plural, and a plurality of pixels comprises a first color pixel, a second color pixel, and a third color pixel,
  wherein the first color pixel comprises a first pixel circuit and a first light-emitting element connected with the first pixel circuit, the second color pixel comprises a second pixel circuit and a second light-emitting element connected with the second pixel circuit, and the third color pixel comprises a third pixel circuit and a third light-emitting element connected with the third pixel circuit, and
  the first color pixel provides red light, the second color pixel provides green light, and the third color pixel provides blue light.

6. The display device of claim 5, wherein a first capacitance of the second capacitor of the first pixel circuit is different from each of a second capacitance of the second capacitor of the second pixel circuit and a third capacitance of the second capacitor of the third pixel circuit.

7. The display device of claim 6, wherein the second capacitance is larger than each of the first capacitance and the third capacitance, and the first capacitance is larger than the third capacitance.

8. The display device of claim 5, wherein a capacitance of the second light-emitting element is larger than each of those of the first light-emitting element and the third light-emitting element, and a capacitance of the first light-emitting element is larger than that of the third light-emitting element.

9. The display device of claim 5, wherein a first capacitance of the second capacitor of the first pixel circuit, a second capacitance of the second capacitor of the second pixel circuit, and a third capacitance of the second capacitor of the third pixel circuit are substantially same.

10. The display device of claim 1, wherein the second capacitor comprises:
  a first electrode connected to the gate electrode of the sixth thin-film transistor; and
  a second electrode connected to the light-emitting element,
  wherein the second electrode of the second capacitor is disposed in a same layer as the gate electrode of the first thin-film transistor.

11. The display device of claim 1, wherein the sixth thin-film transistor comprises:
  a semiconductor pattern;
  the gate electrode on the semiconductor pattern;
  a first connection electrode which is disposed on a plurality of insulation layers on the gate electrode and penetrates through the plurality of insulation layers to be connected to a first portion of the semiconductor pattern; and
  a second connection electrode which is disposed on the plurality of insulation layers and penetrates through the plurality of insulation layers to be connected to a second portion of the semiconductor pattern.

12. The display device of claim 11, wherein the second capacitor comprises:
  a first electrode under the semiconductor pattern; and
  a second electrode under the first electrode of the second capacitor.

13. The display device of claim 12, wherein a thickness of a gate insulation layer between the second electrode of the second capacitor and the first electrode of the second capacitor is less than that of the plurality of insulation layers.

14. The display device of claim 12, where the second electrode of the second capacitor is electrically connected to the second connection electrode.

15. The display device of claim 1, wherein the first capacitor comprises a first electrode electrically connected to the first node, and a second electrode electrically connected to the first driving voltage line, and
  the second capacitor comprises a third electrode electrically connected to the gate electrode of the sixth thin-film transistor and disposed in a same layer as the second electrode of the first capacitor, and a fourth electrode electrically connected with the light-emitting element and disposed in a same layer as the first electrode of the first capacitor.

16. A display device comprising a display panel comprising:
  a pixel comprising:
    a pixel circuit comprising:
      a switching thin-film transistor which transfers a data signal according to a switching operation;
      a driving thin-film transistor which generates a driving current corresponding to the data signal;
      an NMOS-type light emission control thin-film transistor which controls the transfer of the driving current and including an oxide semiconductor layer; and
      a compensation capacitor; and
    a light-emitting element connected to the pixel circuit,
  wherein
  the NMOS-type light emission control thin-film transistor is connected between the driving thin-film transistor and the light-emitting element, and
  the compensation capacitor is connected between a gate electrode of the NMOS-type light emission control thin-film transistor and the light-emitting element.

17. The display device of claim 16, wherein the pixel is provided in plural, and a plurality of pixels comprises a first color pixel, a second color pixel, and a third color pixel,
  wherein the first color pixel comprises a first pixel circuit and a first light-emitting element connected with the first pixel circuit, the second color pixel comprises a second pixel circuit and a second light-emitting element connected with the second pixel circuit, and the third color pixel comprises a third pixel circuit and a third light-emitting element connected with the third pixel circuit, and
  the first color pixel provides red light, the second color pixel provides green light, and the third color pixel provides blue light.

18. The display device of claim 17, wherein a first capacitance of the compensation capacitor of the first pixel circuit, a second capacitance of the compensation capacitor of the second pixel circuit, and a third capacitance of the compensation capacitor of the third pixel circuit are different from each other.

19. The display device of claim 17, wherein a first capacitance of the compensation capacitor of the first pixel circuit, a second capacitance of the compensation capacitor of the second pixel circuit, and a third capacitance of the compensation capacitor of the third pixel circuit are substantially same as each other.

20. The display device of claim 16, wherein the NMOS-type light emission control thin-film transistor comprises:
   a semiconductor pattern;
   the gate electrode on the semiconductor pattern;
   a first connection electrode which is disposed on a plurality of insulation layers disposed on the gate electrode and penetrates through the plurality of insulation layers to be connected to a first portion of the semiconductor pattern; and
   a second connection electrode which is disposed on the plurality of insulation layers and penetrates through the plurality of insulation layers to be connected to a second portion of the semiconductor pattern, and
   the compensation capacitor comprises a first electrode under the semiconductor pattern and a second electrode under the first electrode of the compensation capacitor.

21. A display device comprising:
   a display panel comprising:
      a pixel comprising a pixel circuit, the pixel circuit comprising:
         first thin-film transistor which comprises a gate electrode connected to a first node, a first electrode and a second electrode, and generates a driving current;
         a second thin-film transistor connected between the first electrode of the first thin-film transistor and a data line;
         a third thin-film transistor connected between the first node and the second electrode of the first thin-film transistor;
         a fourth thin-film transistor connected between the first node and an initialization voltage line;
         a fifth thin-film transistor connected between the first electrode of the first thin-film transistor and a first driving voltage line;
         a sixth thin-film transistor which controls a transfer of the driving current;
         a first capacitor connected between the first node and the first driving voltage line; and
         a second capacitor; and
      a light-emitting element connected to the pixel circuit,
   wherein each of the third thin-film transistor and the fourth thin-film transistor is an NMOS thin-film transistor including an oxide semiconductor layer, and each of the first thin-film transistor and the second thin-film transistor is a PMOS thin-film transistor including a silicon semiconductor layer,
   the sixth thin-film transistor is connected between the second electrode of the first thin-film transistor and the light-emitting element, and
   the second capacitor is connected between a gate electrode of the sixth thin-film transistor and the light-emitting element.

22. The display device of claim 21, wherein each of the fifth thin-film transistor and the sixth thin-film transistor is an NMOS thin-film transistor including an oxide semiconductor layer.

23. The display device of claim 21, wherein the pixel is provided in plural, and a plurality of pixels comprises a first color pixel, a second color pixel, and a third color pixel,
   wherein the first color pixel comprises a first pixel circuit and a first light-emitting element connected with the first pixel circuit, the second color pixel comprises a second pixel circuit and a second light-emitting element connected with the second pixel circuit, and the third color pixel comprises a third pixel circuit and a third light-emitting element connected with the third pixel circuit, and
   the first color pixel provides red light, the second color pixel provides green light, and the third color pixel provides blue,
   wherein a first capacitance of the second capacitor of the first pixel circuit is different from each of a second capacitance of the second capacitor of the second pixel circuit and a third capacitance of the second capacitor of the third pixel circuit.

* * * * *